(12) United States Patent
Elger

(10) Patent No.: US 6,887,358 B2
(45) Date of Patent: May 3, 2005

(54) INSTALLATION FOR PROCESSING WAFERS

(75) Inventor: Jürgen Elger, Pyrbaum (DE)

(73) Assignee: Infineon Technologies AG, Munich (DE)

( * ) Notice: Subject to any disclaimer, the term of this patent is extended or adjusted under 35 U.S.C. 154(b) by 351 days.

(21) Appl. No.: 10/134,149

(22) Filed: Apr. 29, 2002

(65) Prior Publication Data

US 2002/0144654 A1 Oct. 10, 2002

Related U.S. Application Data

(63) Continuation of application No. PCT/DE00/03743, filed on Oct. 24, 2000.

(30) Foreign Application Priority Data

Oct. 29, 1999 (DE) .......................................... 199 52 195

(51) Int. Cl.[7] .............................................. H01L 21/00
(52) U.S. Cl. ...................... 204/298.35; 134/61; 134/84; 134/902; 700/225; 700/228; 414/940; 156/345.12; 156/345.24
(58) Field of Search ....................... 204/298.35; 134/61, 134/84, 902; 700/225, 228; 414/940; 156/345.12, 345.24

(56) References Cited

U.S. PATENT DOCUMENTS

| | | | |
|---|---|---|---|
| 4,672,185 A | 6/1987 | Sato et al. | |
| 5,432,702 A | 7/1995 | Barnett | |
| 5,855,681 A | 1/1999 | Maydan et al. | |
| 5,855,726 A | 1/1999 | Soraoka et al. | |
| 6,594,546 B2 * | 7/2003 | Elger | .......................... 700/225 |
| 6,623,231 B2 * | 9/2003 | Elger | ..................... 414/331.01 |

FOREIGN PATENT DOCUMENTS

| | | |
|---|---|---|
| DE | 197 45 386 A1 | 8/1998 |
| JP | 06 286 824 | 10/1994 |
| JP | 11 260 883 | 9/1999 |

* cited by examiner

*Primary Examiner*—Arun S. Phasge
(74) *Attorney, Agent, or Firm*—Laurence A. Greenberg; Werner H. Stemer; Gregory L. Mayback

(57) ABSTRACT

An installation for processing wafers with a plurality of fabrication units and a plurality of measurement units as well as a transport system for transporting the wafers, is described. A transport control unit, which detects a capacity utilization of the installation and saves a processing sequence of the wafers, is allocated to the transport system. As a function of these parameters, control instructions are generated in the transport control unit, and can be output to the transport system for controlling the wafer transport procedure.

25 Claims, 2 Drawing Sheets

INSTALLATION FOR PROCESSING WAFERS

CROSS REFERENCE TO RELATED APPLICATION

This application is a continuation of copending International Application No. PCT/DE00/03743, filed Oct. 24, 2000, which designated the United States and which was not published in English.

BACKGROUND OF THE INVENTION

Field of the Invention

The invention relates to an installation for processing wafers with a plurality of fabrication units and a plurality of measurement units as well as a transport system for transporting the wafers.

Such installations contain a multiplicity of fabrication units, with which different fabrication processes are performed. The fabrication processes involve, in particular, etching processes, wet chemical methods, diffusion processes as well as various cleaning methods, for example chemical mechanical polishing (CMP) methods. One or more fabrication units, in which various fabrication steps of a fabrication process are performed, are provided for each of the processes.

Such installations furthermore contain a multiplicity of measurement units. In the measurement units, the processing quality of one or more fabrication steps of a fabrication process is checked.

The entire fabrication process is subject to stringent purity requirements, so that the fabrication units and measurement units are disposed in a clean room or in a system of clean rooms.

The wafers are delivered in predetermined batch sizes, in containers configured as cassettes, via a transport system to the individual fabrication units. The cassettes are also transported away via the transport system after the wafers have been processed.

The transport system typically has a feeder system with a multiplicity of feeders that, for example, are configured in the form of roller feeders. The cassettes with the wafers are in this case transported resting on the roller feeders. Alternatively, the feeder system may also contain continuous feeders, suspension feeders or the like.

To control such installations, a material disposition system is usually provided. By the material disposition system, wafers are unloaded in a specific number from a storage facility or the like, and are combined into batches. For the individual batches, work plans are compiled which contain the individual processing steps that need to be performed on the wafers, in the individual fabrication units and measurement units, during passage through the installation. Furthermore, priorities for the individual wafers are specified by the material disposition system. Particular processing sequences for the wafers of different batches are obtained with the aid of the prioritization.

Lastly, the wafers are delivered by the material disposition system to the transport system, via which the containers with the wafers are delivered to the individual fabrication units and measurement units. In this case, the containers in the transport system are earmarked with predetermined batch specific transport requests. The transport requests contain, in particular, the destinations for the individual containers, the destinations being formed by fabrication units and measurement units.

The containers are delivered to the individual destinations with the aid of the transport requests. A disadvantage with this is that the transport system is then often utilized non-uniformly. In particular, the situation often arises that a significant number of feeders are overloaded, so that undesirable holdup times occur for the containers located on them. Such holdup times considerably lengthen the throughput times for the wafers in the installation, which in particular also leads to an undesirable increase in the production costs of the wafers.

SUMMARY OF THE INVENTION

It is accordingly an object of the invention to provide an installation for processing wafers which overcomes the above-mentioned disadvantages of the prior art devices of this tub general type, in which the throughput times of the wafers are as short as possible when they are being processed in the installation.

With the foregoing and other objects in view there is provided, in accordance with the invention, an installation for processing wafers. The installation contains a plurality of fabrication units, a plurality of measurement units, and a transport system for transporting the wafers to/from the fabrication units and/or the measurement units. The transport system contains a plurality of components on which the wafers are transported. A transport control unit is provided and is configured to detect a capacity utilization of the components of the transport system and to save a processing sequence of the wafers. The transport control unit is allocated to the transport system, and, in dependence on the capacity utilization of the transport system and the processing sequence of the wafers, the transport control unit generates control instructions received by the transport system for controlling a wafer transport procedure.

According to the invention, the transport control unit, that is configured for detecting the capacity utilization of the installation and for saving the processing sequences of the wafers, is allocated to the transport system.

As a function of the capacity utilization of the installation and the processing sequence of the wafers, control instructions are generated in the transport control unit and can be output to the transport system for controlling the wafer transport procedure.

The basic idea of the invention is that the transport of the wafers via the transport system can be matched rapidly and flexibly to the capacity utilization of the installation by the transport control unit. In particular, devices for detecting the capacity utilizations of the individual components of the transport system are provided, which are for example formed by sensors.

These are used, in the transport control unit, to detect which transport paths are currently overloaded and which still have free transport capacities. The extent of the present overload of the individual fabrication units and measurement units is furthermore detected.

This information is used in the transport control unit to generate control instructions, with the aid of which the wafers are delivered to the individual destinations while optimally using the transport and processing capacities of the installation.

In particular, the control instructions may be formed in such a way as to generate transport requests matched to the current transport and processing capacities.

In this case, transport requests for individual wafer containers are advantageously also divided into transport sub-requests. The restriction of the wafers to a particular container during passage through the installation is hence eliminated. Instead, the transport control unit groups the wafers so that they can be delivered, in a way which matches the current processing status, as directly as possible and without holdup times to the respectively suitable fabrication unit or measurement unit.

Furthermore, suitable selection of the transport path is respectively carried out for the wafers in the transport control unit, in particular with overloaded subsections of the transport system being circumvented.

In this way, the throughput times for the wafers in the installation can be kept very short.

In accordance with an added feature of the invention, the components of the transport system include a feeder system with a plurality of feeders on which the wafers are transported and a plurality of containers for holding the wafers. The containers are transported by the feeders.

In accordance with another feature of the invention, the sensors are formed as barcode readers for identifying the containers labeled with barcodes and the wafers labeled with the barcodes. In addition some of the sensors are formed as photoelectric barriers, and the sensors are disposed along the transport system.

In accordance with an additional feature of the invention, a production management system is connected to the transport control unit. The production management system registers continuously a processing status of individual batches of the wafers. The production management system is configured for determining capacity utilization information of each of the fabrication units and each of the measurement units. The production management system forwards the capacity utilization information to the transport control unit and the transport control unit saves the capacity utilization information. The production management system is configured to register processing statuses of the wafers of different batches, and for continuously establishing processing sequences of the wafers in dependence on the processing statuses. The production management system forwards the processing statuses and the processing sequences of the wafers to the transport control system. The production management system generates transport requests in dependence on the processing sequences of the wafers. The transport requests identify individual ones of the containers or the batches of the wafers and the transport requests are forwarded to the transport control unit.

In accordance with a further feature of the invention, the production management system is configured to assign priorities to the batches of the wafers.

In accordance with a further added feature of the invention, the transport system has a technical feeder control connected to the transport control unit. The transport system has motors and transducers for driving the components of the transport system, and the technical feeder control controls the motors and the transducers. The technical feeder control is configured for entering error messages received from the components of the transport system into the transport control unit. The technical feeder control receives and stores the control instructions supplied by the transport control unit.

In accordance with a further additional feature of the invention, a number of the wafers located on each of the components of the transport system is registered by the sensors, and is saved in the transport control unit. The sensors determine an occupancy of the wafers in each of the containers for each of the components of the transport system, and the occupancy is saved in the transport control unit.

In accordance with another further feature of the invention, the transport control unit is configured to break down the transport requests into transport sub-requests. The transport control unit performs the break down of the transport requests into the transport sub-requests in dependence on the processing statuses of the wafers. The transport control unit is configured to define transport paths for the transport requests and the transport sub-requests, and for outputting the transport paths as a constituent of the control instructions. The transport control unit defines the transport paths in dependence on the processing statuses of the wafers, the capacity utilization of the components of the transport system, and/or the capacity utilization information of the fabrication units and the measurement units.

In accordance with another added feature of the invention, one of the containers is identified and transported via the transport paths to one of the fabrication units or the measurement units forming a destination, if the one of the fabrication units and the measurement units has available working capacity.

In accordance with another additional feature of the invention, one of the containers is identified and transported via the transport paths to a buffer in a vicinity of a destination, if one of the fabrication units and the measurement units forming the destination does not have any available working capacity.

In accordance with a concomitant feature of the invention, the transport control unit has at least one computer unit.

Other features which are considered as characteristic for the invention are set forth in the appended claims.

Although the invention is illustrated and described herein as embodied in an installation for processing wafers, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
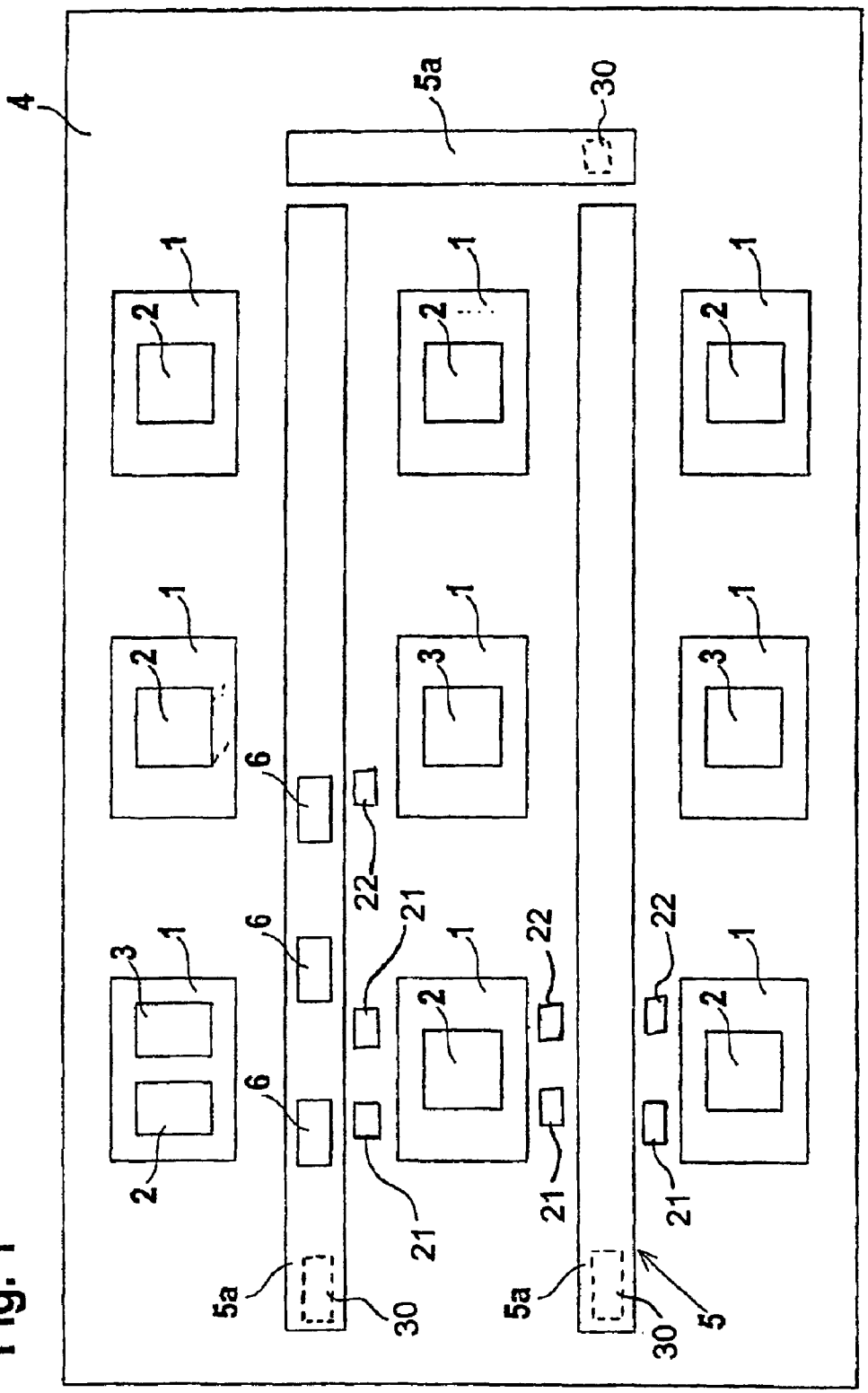
FIG. 1 is a schematic representation of an installation for fabricating semiconductor products with a configuration of processing stations according to the invention.

Referring now to the figures of the drawing in detail and first, particularly, to FIG. 1 thereof, there is shown a schematic representation of an installation for processing wafers. The installation has a multiplicity of processing stations 1, with one or more fabrication units 2 or measurement units 3 being provided in a processing station 1.

The fabrication units 2 are used to perform different fabrication steps in the fabrication processes needed for processing the wafers. The fabrication processes contain, in particular, etching processes, wet chemical methods, diffusion processes as well as cleaning methods. One or more fabrication units 2 may be provided for the individual processes, according to the number of fabrication steps to be performed.

The measurement units 3 are used to check the processing quality of the fabrication steps performed in the individual fabrication units 2.

The processing stations 1, with the individual fabrication units 2 and the measurement units 3, are disposed in a clean room 4, and are connected to one another via a transport system. Alternatively, the processing stations 1 may be distributed throughout a system of clean rooms 4.

The transport system has a feeder system 5 with a plurality of feeders 5a, which deliver the wafers to the individual processing stations 1. For delivering and removing the wafers, the processing stations 1 have non-illustrated loading and unloading stations. The wafers are in this case transported in containers 6 which are preferably configured as cassettes. The feeders 5a may be configured in the form of roller feeders, continuous feeders or the like. Transfer stations or the like, for transferring the wafers, may be provided between the feeders 5a. The transport system may furthermore have a non-illustrated storage system that contains a plurality of storage units distributed in the clean room 4. The storage units may, in particular, be configured as stockers. The containers 6 with the wafers are temporarily deposited in the storage units. For example, they may be used for temporarily depositing the containers 6 which contain wafers that have been incorrectly processed in the individual fabrication units 2. At suitable times, these wafers are unloaded from the storage units and delivered to particular fabrication units 2 for reprocessing.

In the present exemplary embodiment, the wafers are transported, via the transport system, fully automatically and without any human intervention. Alternatively, the wafers may also be transported in part manually.

Figure 2:
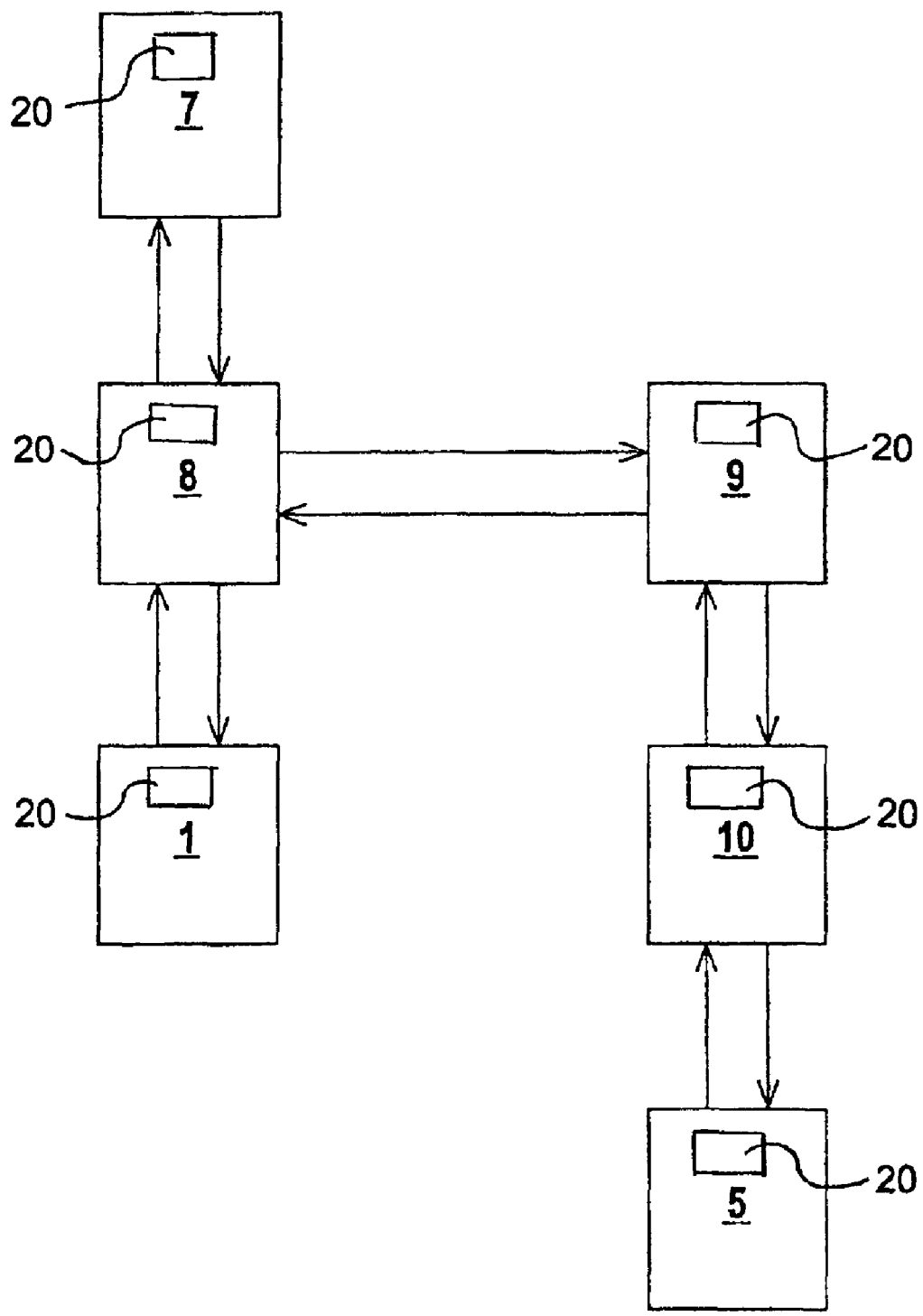
FIG. 2 is a block diagram of components for the process control of the installation shown in FIG. 1.

FIG. 2 shows a block diagram for the process control of the installation for processing the wafers. A central production planning and control system 7 is connected to a production management system 8. The individual processing stations 1, with the fabrication units 2 and the measurement units 3, are connected to the production management system 8. A transport control unit 9 is furthermore connected to the production management system 8. A technical feeder control 10, which is connected to the feeder system 5 of the transport system, is in turn connected to the transport control unit 9.

The aforementioned components of the installation each respectively have at least one computer unit 20. The connections between the individual components are respectively configured as bi-directional data lines between the individual computer units 20 of the components.

The production planning and control system 7 is used for capacity determination and demand determination for the entire installation. The capacities and demands for processing the wafers in the individual fabrication 2 and measurement units 3 are preplanned for periods of the order of a few days to weeks. The planning is used to allocate particular processing steps for the fabrication units 2 and the measurement units 3 that are particularly suitable therefor. Fabrication requests and work plans for processing the wafers are furthermore generated in the production planning and control system 7.

In the production management system 8, a plurality of wafers are combined into batches at the start of the processing procedure, with the wafers of a batch being initially fitted. To that end, the corresponding wafers are unloaded from a storage facility by the production management system 8, and are fitted into the containers 6 manually or by a machine.

By the production planning and control system 7, the individual work plans and fabrication requests are entered into the production management system 8, saved and administered.

With the aid of the work plans and fabrication requests, the corresponding specifications are entered into the individual fabrication 2 and measurement units 3 by the production management unit 8. From the individual fabrication 2 and measurement units 3, the current statuses of the units are respectively communicated to the production management system 8. In particular, the current processing statuses of the individual wafers in the individual fabrication 2 and measurement units 3 are also entered into the production management system 8.

All this information is continuously registered in the production management system 8, so that the current processing statuses of the wafers, as well as the capacity utilizations of the fabrication 2 and measurement units 3, are available in the production management system 8.

With the aid of the data, the wafer output of the installation is detected in the production management system 8 and reported to the production planning and control system 7.

The data is furthermore used in the production management system 8 to carry out prioritization for processing the individual wafers or batches, the planning typically varying within a time frame of a few minutes to hours. The prioritization of the wafers is in this case dependent, in particular, on their processing statuses.

The transport control unit 9 is used for controlling the entire transport system. To that end, the capacity utilizations of the individual fabrication units 2, measurement units 3 and, in particular, the components of the transport system, are continuously detected in the transport control unit 9. As a function of these parameters, as well as the processing statuses of the wafers, control instructions are generated in the transport control unit 9, the wafer transport procedure being carried out as a function of these instructions. This control is preferably carried out virtually without any time lags, or with reaction times of at most a few seconds.

The processing statuses and processing sequences of the wafers are input by the production management system 8 into the transport control unit 9. The processing sequences of the wafers are defined by the priority specification in the production management system 8. As a function thereof, the transport requests for the wafers are generated in the production management system 8 and entered into the transport control unit 9. The transport requests preferably relate respectively to a batch of wafers. The capacity utilizations of the individual fabrication 2 and measurement units 3 are detected in the production management system 8, and are likewise entered into the transport control unit 9.

In order to detect the capacity utilizations of the other components of the installation, in particular of the transport system, a system of sensors 21 is provided whose output signals are entered into the transport control unit 9.

In this case, in particular, the sensors 21 are formed by barcode readers 21. The barcode readers 21 are used to detect barcodes that are disposed on the individual containers 6, on the one hand, and directly on the wafers, on the other hand. The containers 6 and the wafers can be uniquely identified with the aid of the barcodes.

It is important to identify the wafers themselves, in particular, because the container 6 may be filled with different batches during the wafer processing in the fabrication 2 and measurement units 3. If such is the case, in order to be able to track the wafers according to their processing statuses during passage through the installation, it is no longer sufficient just to identify the container 6.

The barcode readers are disposed in a sufficient number at the individual feeders 5a of the transport system. Barcode readers are furthermore disposed at the transfer stations between the feeders 5a. Lastly, in addition to the barcode readers 21, other sensors such as photoelectric barriers 22 or the like may also be provided, which are respectively used to detect the passage of the containers 6 through a monitoring section.

The technical feeder control 10 connected to the transport control unit 9 essentially has one or more of the computer units 20 for controlling drive elements of the transport system. The drive elements 30 (FIG. 1) are formed, in particular, by motors and transducers, which are used to drive the components of the transport system, in particular the individual feeders 5a. The operation of the technical feeder control 10 is controlled by the control instructions, which are entered by the transport control unit 9 into the technical feeder control 10. Reciprocally, control parameters of the technical feeder control 10, in particular the operating statuses of the individual components of the transport system and possible error messages, are entered by the technical feeder control 10 into the transport control unit 9.

In the transport control unit 9, the output signals of the technical feeder control 10 are used, in particular, to detect the utilization level of the individual components of the transport system. To that end, the number of wafer containers 6 located on the components of the transport system, in particular on the feeders 5a, is detected.

This yields the occupancy of the feeders 5a by the containers 6. In particular, the question of whether individual feeders 5a are overloaded, so that container jams might occur, is determined. The availability of the individual components of the transport system is furthermore detected, in particular with respect to whether or not the individual feeders 5a are functioning correctly.

From the information obtained by the sensor system and from the data entered into the production management system 8, the control instructions for the technical feeder control 10 are generated in the transport control unit 9. First, in the transport control unit 9, the question is evaluated as to whether wafers of only one batch or of a plurality of batches are located in a container 6. In the latter case, a transport request generated in the production management system 8 for a container 6 is not sent unmodified in the transport control unit 9, but instead is divided into suitable transport sub-requests. The wafers allocated to various transport sub-requests are then correspondingly delivered, in separate containers 6, to the respectively suitable fabrication 2 or measurement units 3. To that end, the wafers are transferred into the suitable containers 6 at suitable points, in particular at the transfer stations or special transfer devices.

The transport requests, or the sub-requests, form parts of the control instructions that are output by the transport control unit 9 to the technical feeder control 10.

The information saved in the transport control unit 9 is furthermore used for determining suitable destinations for the containers 6 to be transported, as well as suitable transport paths for the containers 6, which are likewise constituents of the control instructions output by the transport control unit 9.

The destinations are selected as a function of the processing statuses of the wafers. Depending on the processing status of the wafers in the container 6, a suitable fabrication 2 or measurement unit 3 is defined as a destination, if the latter presently has free processing capacities. If the relevant fabrication 2 or measurement unit 3 is presently overloaded or actually inoperative, however, a destination that lies as close as possible to the measurement unit 3 or the fabrication unit 2 is defined, in order to ensure that the container 6 can be delivered quickly to this fabrication 2 or measurement unit 3 as soon as the latter is available again. Expediently, the containers 6 are temporarily deposited in a store which lies as close as possible to the respective fabrication 2 and measurement unit 3.

The respective transport path is determined in the transport control unit 9 so that the destination is approached only via components of the transport system that have free transport capacities. In particular, the transport path is selected in such a way as to circumvent overloaded or inoperative feeders 5a.

I claim:

1. An installation for processing wafers, the installation comprising:
   a plurality of fabrication units;
   a plurality of measurement units;
   a transport system for transporting the wafers to/from at least one of said fabrication units and said measurement units, said transport system containing a plurality of components on which the wafers are transported; and
   a transport control unit configured to detect a capacity utilization of said components of said transport system and configured to save a processing sequence of the wafers, said transport control unit being allocated to said transport system, and, in dependence on the capacity utilization of said transport system and the Processing sequence of the wafers, said transport control unit generating control instructions received by said transport system for controlling a wafer transport procedure.

2. The installation according to claim 1, wherein said components of said transport system include a conveyor system with a plurality of conveyors on which the wafers are transported and a plurality of containers for holding the wafers, said containers are transported by said conveyors.

3. The installation according to claim 2, wherein said transport control unit has a plurality of sensors for detecting the capacity utilization of the transport system.

4. The installation according to claim 3, wherein said sensors are formed as barcode readers for identifying said containers labeled with barcodes and the wafers labeled with the barcodes.

5. The installation according to claim 3, wherein said sensors are formed as photoelectric barriers.

6. The installation according to claim 3, wherein said sensors are disposed along said transport system.

7. The installation according to claim 3, wherein a number of the wafers located on each of said components of said transport system is registered by said sensors, and is saved in said transport control unit.

8. The installation according to claim 7, wherein said sensors determine a wafer container utilization rate of said components of said transport system, and the utilization rate is saved in said transport control unit.

9. The installation according to claim 2, further comprising a production management system connected to said transport control unit, said production management system registering continuously a processing status of individual batches of the wafers.

10. The installation according to claim 9, wherein said production management system is configured for determining capacity utilization information of each of said fabrication units and each of said measurement units, said production management system forwards the capacity utilization information to said transport control unit and said transport control unit saves the capacity utilization information.

11. The installation according to claim 10, wherein said production management system is configured to register processing statuses of the wafers of different batches, and for continuously establishing processing sequences of the wafers in dependence on the processing statuses.

12. The installation according to claim 11, wherein said production management system forwards the processing statuses and the processing sequences of the wafers to said transport control system.

13. The installation according to claim 12, wherein said production management system generates transport requests in dependence on the processing sequences of the wafers, the transport requests identifying individual ones of said containers or the batches of the wafers and the transport requests are forwarded to said transport control unit.

14. The installation according to claim 13, wherein said production management system is configured to assign priorities to the batches of the wafers.

15. The installation according to claim 13, wherein said transport system has a technical conveyor control connected to said transport control unit.

16. The installation according to claim 15, wherein said transport system has motors and transducers for driving said components of said transport system, and said technical conveyor control controls said motors and said transducers.

17. The installation according to claim 16, wherein said technical conveyor control is configured for entering error messages received from said components of said transport system into said transport control unit.

18. The installation according to claim 16, wherein said technical conveyor control receives arid stores the control instructions supplied by said transport control unit.

19. The installation according to claim 18, wherein said transport control unit is configured to break down the transport requests into transport sub-requests.

20. The installation according to claim 19, wherein said transport control unit performs the break down of the transport requests into the transport sub-requests in dependence on the processing statuses of the wafers.

21. The installation according to claim 19, wherein said transport control unit is configured to define transport paths for the transport requests and the transport sub-requests, and for outputting the transport paths as a constituent of the control instructions.

22. The installation according to claim 21, wherein said transport control unit defines the transport paths in dependence on at least one of the processing statuses of the wafers, the capacity utilization of said components of said transport system, and the capacity utilization information of said fabrication units and said measurement units.

23. The installation according to claim 22, wherein one of said containers is identified and transported via the transport paths to one of said fabrication units and said measurement units forming a destination, if said one of said fabrication units and said measurement units has available working capacity.

24. The installation according to claim 23, wherein one of said containers is identified and transported via the transport paths to a buffer in a vicinity of a destination, if one of said fabrication units and said measurement units forming maid destination does not have any available working capacity.

25. The installation according to claim 1, wherein said transport control unit has at least one computer unit.

* * * * *